(12) United States Patent
Eom

(10) Patent No.: US 10,170,496 B2
(45) Date of Patent: Jan. 1, 2019

(54) SEMICONDUCTOR DEVICE AND MANUFACTURING METHOD THEREOF

(71) Applicant: SK hynix Inc., Icheon-si Gyeonggi-do (KR)

(72) Inventor: Dae Sung Eom, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 23 days.

(21) Appl. No.: 15/486,845

(22) Filed: Apr. 13, 2017

(65) Prior Publication Data

US 2018/0040629 A1 Feb. 8, 2018

(30) Foreign Application Priority Data

Aug. 2, 2016 (KR) ........................ 10-2016-0098512

(51) Int. Cl.
| | |
|---|---|
| *H01L 27/11582* | (2017.01) |
| *H01L 21/768* | (2006.01) |
| *H01L 23/522* | (2006.01) |
| *H01L 23/528* | (2006.01) |
| *H01L 27/11568* | (2017.01) |
| *H01L 27/11573* | (2017.01) |
| *H01L 27/1157* | (2017.01) |
| *H01L 27/11575* | (2017.01) |

(52) U.S. Cl.
CPC .. *H01L 27/11582* (2013.01); *H01L 21/76897* (2013.01); *H01L 23/528* (2013.01); *H01L 23/5226* (2013.01); *H01L 27/1157* (2013.01); *H01L 27/11568* (2013.01); *H01L 27/11573* (2013.01); *H01L 27/11575* (2013.01)

(58) Field of Classification Search
CPC ................................................ H01L 27/11582
See application file for complete search history.

(56) References Cited

U.S. PATENT DOCUMENTS

| | | | |
|---|---|---|---|
| 2011/0121403 A1* | 5/2011 | Lee .................... | H01L 27/11526 257/390 |
| 2012/0003831 A1* | 1/2012 | Kang ................. | H01L 27/11551 438/639 |
| 2012/0206979 A1* | 8/2012 | Shin ................... | H01L 27/11582 365/185.26 |
| 2015/0041901 A1* | 2/2015 | Son ..................... | G11C 16/0483 257/368 |
| 2016/0013202 A1* | 1/2016 | Hwang .............. | H01L 27/11565 257/314 |
| 2017/0011996 A1* | 1/2017 | Lee ..................... | H01L 27/1157 |

FOREIGN PATENT DOCUMENTS

| | | |
|---|---|---|
| KR | 1020100094386 A | 8/2010 |
| KR | 1020120121171 A | 11/2012 |
| KR | 1020150139357 A | 12/2015 |

* cited by examiner

*Primary Examiner* — Charles D Garber
*Assistant Examiner* — Alia Sabur
(74) *Attorney, Agent, or Firm* — William Park & Associates Ltd.

(57) ABSTRACT

A semiconductor device in accordance with an embodiment may include a cell structure, a source coupling structure, and a source discharge transistor. The cell structure may include alternately stacked first conductive patterns and first interlayer insulating layers enclosing a channel layer. The source coupling structure separated from the cell structure may include alternately stacked second conductive patterns and second interlayer insulating layers. The source discharge transistor may be coupled to the source coupling structure.

20 Claims, 11 Drawing Sheets

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2016-0098512 filed on Aug. 2, 2016 in the Korean Intellectual Property Office, the entire disclosure of which is incorporated herein by reference.

BACKGROUND

1. Technical Field

Various embodiments of the present disclosure generally relate to a semiconductor device and a manufacturing method thereof, and more particularly to a semiconductor device, which can mitigate a source line bouncing phenomenon, and a manufacturing method thereof.

2. Related Art

As miniaturization of electronic systems proceeds, designs for semiconductor devices follow suit. The desire to improve integration density leads to the development of three-dimensional semiconductor devices. Examples of the three-dimensional semiconductor devices may include three-dimensional semiconductor memory devices.

The memory cells of the three-dimensional semiconductor memory device may therefore be vertically stacked on top of each other. In an example where many memory cells form a memory cell string, the memory cells may be coupled in series to each other through a channel layer on a memory cell string basis. Here, the channel layer may be coupled to a bit line and a source line.

A common source line may be coupled to large numbers of memory cell strings. As a result, if many memory cell strings are activated at the same time, an unexpected large amount of current can possibly flow through the common source line, and this may result in a source line bouncing phenomenon in which the voltage of the common source line fluctuates. The source line bouncing phenomenon may cause the semiconductor memory device to malfunction.

SUMMARY

In an embodiment of the present disclosure, a semiconductor device may include a cell structure, a source coupling structure, and a source discharge transistor. The cell structure may include alternately stacked first conductive patterns and first interlayer insulating layers enclosing a channel layer. The source coupling structure separated from the cell structure may include alternately stacked second conductive patterns and second interlayer insulating layers. The source discharge transistor may be coupled to the source coupling structure.

In an embodiment of the present disclosure, a method of manufacturing a semiconductor device may include forming a source discharge transistor on a substrate. The method may include forming, on the source discharge transistor, a stack formed by alternately stacking first material layers and second material layers. The method may include forming a slit by which the stack is separated into a first stack and a second stack. The method may include replacing the second material layers of the first and second stacks with conductive patterns through the slit, and forming a cell structure and a source coupling structure. The method may include forming contact plugs coupled to the conductive patterns of the source coupling structure and the source discharge transistor. The method may also include forming, on the contact plugs, a source pick-up line coupling the source discharge transistor to the source coupling structure.

DETAILED DESCRIPTION

Figure 1:
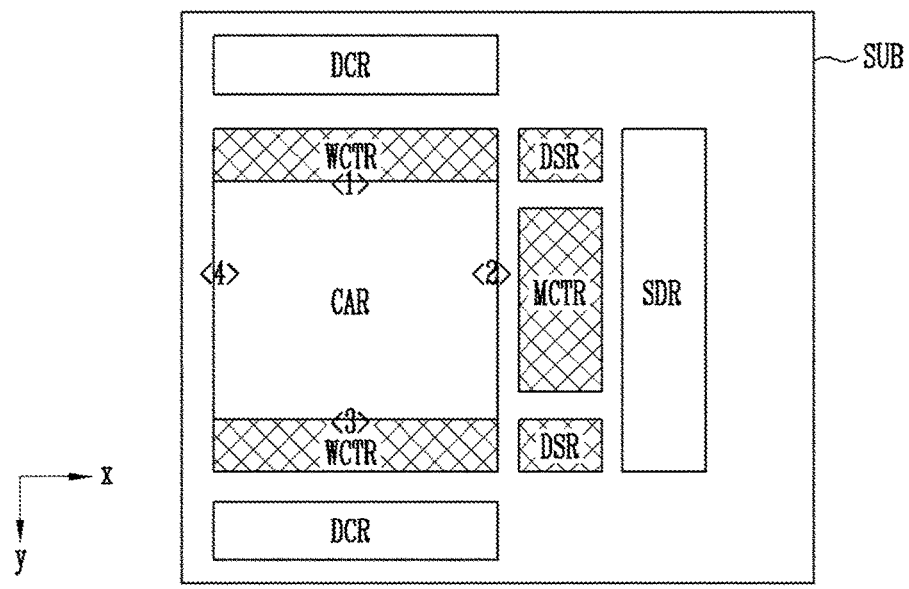
FIG. 1 is a diagram illustrating an example of a semiconductor memory device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating an example of a semiconductor memory device according to an embodiment of the present disclosure.

Referring to FIG. 1, the semiconductor memory device according to an embodiment of the present disclosure may include a cell array region CAR, a word line contact region WCTR, a decoding circuit region DCR, a metal line contact region MCTR, a dummy structure region DSR, and a source discharge region SDR.

The cell array region CAR is a region in which a memory cell array is disposed. Memory cell strings may be disposed in the cell array region CAR. For example, each of the memory cell string may include at least one source select transistor, a plurality of source side memory cells, at least one pipe transistor, a plurality of drain side memory cells, and at least one drain select transistor, and these memory cells and transistors may be coupled in series to each other. In another example, each memory cell string may include at least one source select transistor, a plurality of memory cells, and at least one drain select transistor, and these memory cells and transistors may be coupled in series to each other and arranged in the cell array region CAR. The memory cell string may have a U shape. Alternatively, the memory cell string may extend in one direction along a channel layer protruding from a surface of a substrate SUB.

Word lines, select lines, and bit lines are disposed in the cell array region CAR. The word lines and bit lines are electrically coupled to the memory cells.

The word line contact region WCTR is a region that extends from the word lines stacked on the cell array region CAR to respectively drive the stacked memory cells. The word line contact region WCTR is coupled to word line contact plugs. Although not illustrated, the semiconductor device may further include a select line contact region, which extends from select lines formed in the cell array region CAR.

For example, the cell array region CAR may have at least four sides (e.g., first through fourth sides <1> to <4>), and the word line contact region WCTR may be in contact with at least one of the first side <1> and the third side <3> facing each other. For example, in a case where the memory cell strings are arranged in a U shape, as shown in FIG. 1, the word line contact region WCTR may be located right next to each of the first side <1> and the third side <3>. In another example, in the case where the memory cell strings are arranged in a straight line shape, the word line contact region WCRT may be located at either one of the first side <1> and the third side <3>.

The word line contact region WCTR may be disposed between the cell array region CAR and the decoding circuit region DCR. An interconnection structure that electrically couples the word lines to driving transistors of the decoding circuit region DCR may be disposed in the word line contact region WCTR. The interconnection structure may include word line contact plugs.

The word lines may extend from the cell array region CAR to the word line contact region WCTR. To facilitate the electrical coupling between the stacked word lines and the word line contact plugs, the word lines may be formed to have a stepwise structure in the word line contact region WCTR.

The decoding circuit region DCR is a region that has driving transistors coupled to memory cell strings formed on the cell array region CAR through the select lines and the word lines to provide operating voltages to the memory cell strings. For example, the decoding circuit region DCR may include a row decoder. The row decoder may include pass transistors that are used to selectively provide the operating voltages to the select lines and the word lines.

The metal line contact region MCTR is a region that has stacked metal lines and metal line contact plugs to reduce a source line bouncing phenomenon. For example, in the case where the cell array region CAR has the first through fourth sides <1> to <4>, the metal line contact region MCTR may be disposed adjacent to the second side <2> connected to the first side <1>, which is in contact with the word line contact region WCTR. The metal line contact region MCTR may be spaced apart from the second side <2> of the cell array region CAR, and may be disposed to face the second side <2> of the cell array region CAR.

The metal line contact region MCTR may be disposed between the cell array region CAR and the source discharge region SDR. An interconnection structure that electrically couples the common source line to a source discharge transistor disposed in the source discharge region SDR may be disposed in the metal line contact region MCTR. The interconnection structure may be metal line contact plugs.

Unlike the word lines, the metal lines do not extend from the cell array region CAR. The metal line contact region MCTR is spaced apart from the cell array region CAR. The metal lines may be used to interconnect various components in the metal line contact region MCTR.

The metal line contact region MCTR may be defined using a patterning process for forming the stepwise structure in the word line contact region WCTR. In addition, in an embodiment of the present disclosure, the stepwise structure that may be formed in the process of patterning the word line contact region WCTR remains in the metal line contact region MCTR to be used in reducing the source line bouncing phenomenon. In an embodiment of the present disclosure, by using this stepwise structure in reducing the source line bouncing phenomenon, rather than disposing a structure for reducing the source line bouncing phenomenon in an additional space, extra spaces may be used as the metal line contact region MCTR.

During a process of forming the stepwise structure for reducing the source line bouncing phenomenon in the metal line contact region MCTR, a dummy structure may remain in the dummy structure region DSR. The dummy structure may be disposed in the dummy structure region DSR spaced apart from the metal line contact region MCTR.

The dummy structure region DSR may be disposed between the word line contact region WCTR and the source discharge region SDR. The dummy structure region DSR may be disposed on each of the opposite sides of the metal line contact region MCTR. The dummy structure on the dummy structure region DSR may be disposed such that it is spaced apart from all of a word line stack structure on the cell array region CAR and word line contact region WCTR and the stepwise structure on the metal line contact region MCTR by slits (SI of FIG. 2), which will be described later herein.

The source discharge region SDR is a region that has the source discharge transistor coupled to the common source line extending from the cell array region CAR to discharge voltages of the common source lines. For example, when the semiconductor device is in operation, the voltage level of a bit line may be discharged from a precharge level to the ground voltage level through the source discharge transistor coupled to the common source line.

The source discharge region SDR and at least one side (e.g., the second side <2>) of the cell array region CAR may be disposed on opposite sides of the metal line contact region MCTR.

As will be described below, in the source discharge region SDR and the metal line contact region MCTR, a vertical stack mesh structure is provided to mitigate the source line bouncing phenomenon.

Although not illustrated, the semiconductor memory device may include peripheral circuitry such as a page buffer, a word line driver, a sense amp, a control circuit, which functions to drive the memory cells and read data stored in the memory cells.

Figure 2:
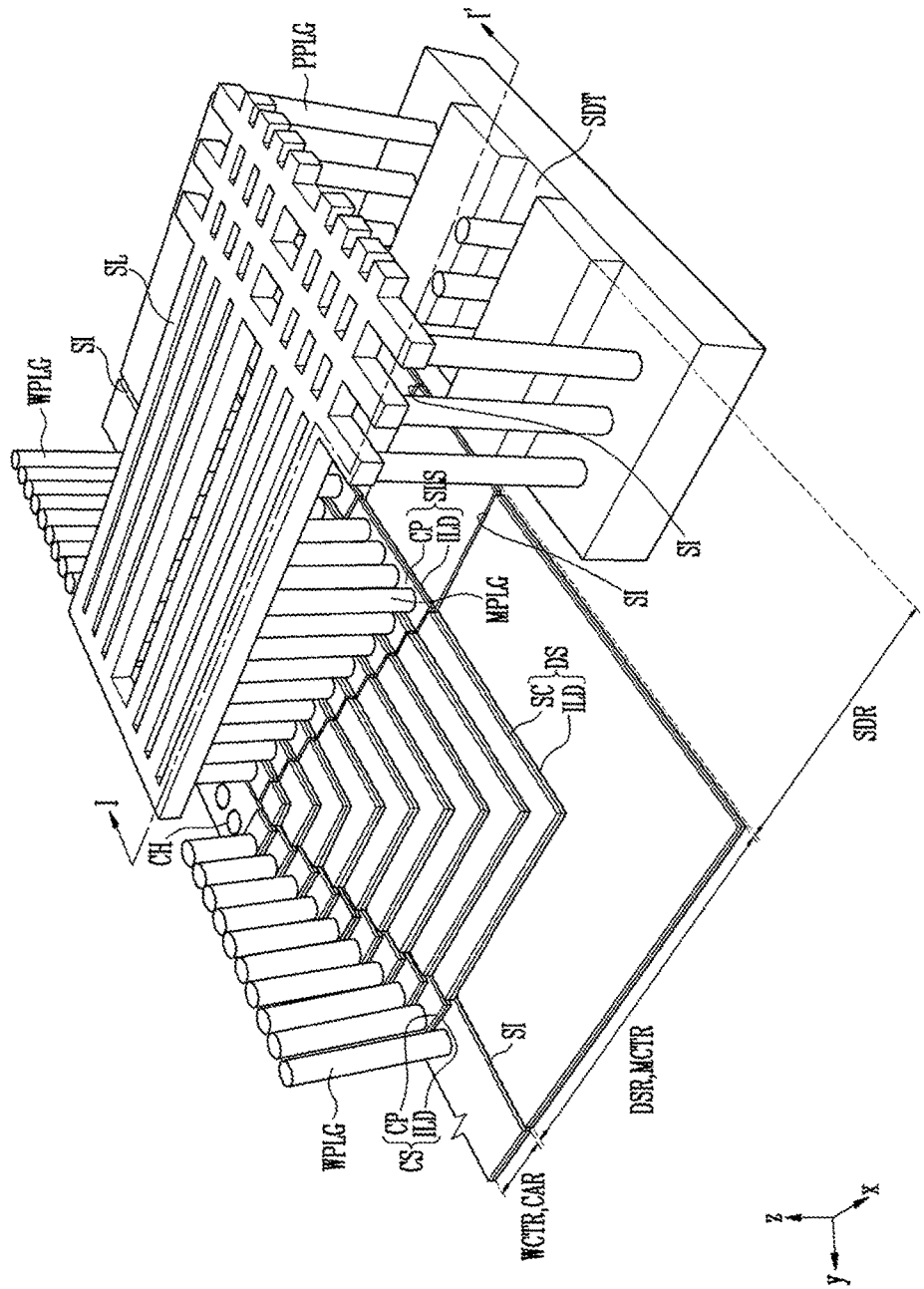
FIG. 2 is a perspective view illustrating an example of a vertical stack mesh structure adjacent to a source discharge transistor in the semiconductor device according to an embodiment of the present disclosure.

FIG. 2 is a perspective view illustrating an example of a vertical stack mesh structure of the semiconductor device according to an embodiment of the present disclosure.

Referring to FIG. 2, the semiconductor device according to an embodiment of the present disclosure may include a cell structure CS and a source coupling structure SLS each of which has a stepwise structure. The semiconductor device according to an embodiment of the present disclosure may further include a dummy structure DS having a stepwise structure. The cell structure CS, the source coupling structure SLS and the dummy structure DS are separated from each other by the slits SI.

Each of the cell structure CS and the source coupling structure SLS includes interlayer insulating layers ILD and conductive patterns CP that are alternately stacked. The interlayer insulating layers ILD and conductive patterns CP of the cell structure CS are separated from the interlayer insulating layers ILD and conductive patterns CP of the source coupling structure SLS by the slits SI.

The cell structure CS extends from the cell array region CAR to the word line contact region WCTR, and forms a stepwise structure on the word line contact region WCTR. The conductive patterns CP of the cell structure CS are coupled to word line contact plugs WPLG disposed on the word line contact region WCTR so that electrical signals are applied to the conductive patterns CP. The stacked conductive patterns CP of the cell structure CS may form the stepwise structure on the word line contact region WCTR to easily connect the word line contact plugs WPLG to the stacked conductive patterns CP. The cell structure may be penetrated by channel layers CH disposed on the cell array region CAR. Each of the channel layers CH may have various shapes depending on the structures of corresponding memory cell strings. Detailed examples of the shape of each channel layer CH and the memory cell string structure will be described later herein with reference to FIGS. 4a and 5.

The source coupling structure SLS is disposed adjacent to the cell structure CS on the metal line contact region MCTR. The source coupling structure SLS includes interlayer insulating layers ILD and conductive patterns CP that are alternately stacked on the metal line contact region MCTR. The interlayer insulating layers ILD and conductive patterns CP of the source coupling structure SLS form a stepwise structure on the metal line contact region MCTR. The conductive patterns CP of the source coupling structure SLS are coupled to metal line contact plugs MPLG disposed on the metal line contact region MCTR so that electrical signals are applied to the conductive patterns CP. The stacked conductive patterns CP of the source coupling structure SLS may form the stepwise structure on the metal line contact region MCTR to easily connect the metal line contact plugs MPLG to the stacked conductive patterns CP.

The stacked conductive patterns CP of the source coupling structure SLS may be coupled to a source pick-up line ESL via the metal line contact plugs MPLG.

The source pick-up line ESL is coupled to the common source line, which is coupled to the channel layers CH of the cell array region CAR. A connection structure between the source pick-up line ESL and the common source line may be modified in various forms depending on the memory cell string structure. The connection structure between the source pick-up line ESL and the common source line will be described later herein with reference to FIGS. 4a to 5. The source pick-up line ESL is disposed on upper ends of the metal line contact plugs MPLG, and is coupled to the metal line contact plugs MPLG. The source pick-up line ESL extends from space over the metal line contact region MCTR to a space over the source discharge region SDR. The source pick-up line ESL is coupled to the source discharge transistor SDT on the source discharge region SDR. A junction region of the source discharge transistor SDR may be coupled to one of peripheral contact plugs PPLG. The source pick-up line ESL may be coupled to the peripheral contact plugs PPLG, and may be coupled to the source discharge transistor SDT via the peripheral contact plugs PPLG.

The conductive patterns CP stacked on the metal line contact region MCTR, the metal line contact plugs MPLG coupled to the conductive patterns CP, and the source pick-up line ESL may form the vertical stack mesh structure. The source pick-up line ESL may have a structure including a plurality of strands that respectively extend in a row direction (e.g., x-direction) and a column direction (e.g., y-direction).

The dummy structure DS is disposed on the dummy structure region DSR. The dummy structure DS may include interlayer insulating layers ILD and sacrificial layers SC that are alternately stacked. The interlayer insulating layers ILD and sacrificial layers SC of the dummy structure DS may form a stepwise structure. The dummy structure DS may be separated from the cell structure CS and the source coupling structure SLS by the slits SI. The interlayer insulating layers ILD (e.g., dummy interlayer insulating layers) of the dummy structure DS, the interlayer insulating layers ILD (e.g., source interlayer insulating layers) of the source coupling structure SLS, and the interlayer insulating layers ILD (e.g., cell interlayer insulating layers) of the cell structure CS may be respectively disposed on the same layers. The sacrificial layers SC of the dummy structure DS, the conductive patterns CP (e.g., coupling conductive patterns) of the source coupling structure SLS, and the conductive patterns CP (e.g., cell conductive patterns) of the cell structure CS may be disposed on the same layers.

Figure 3:
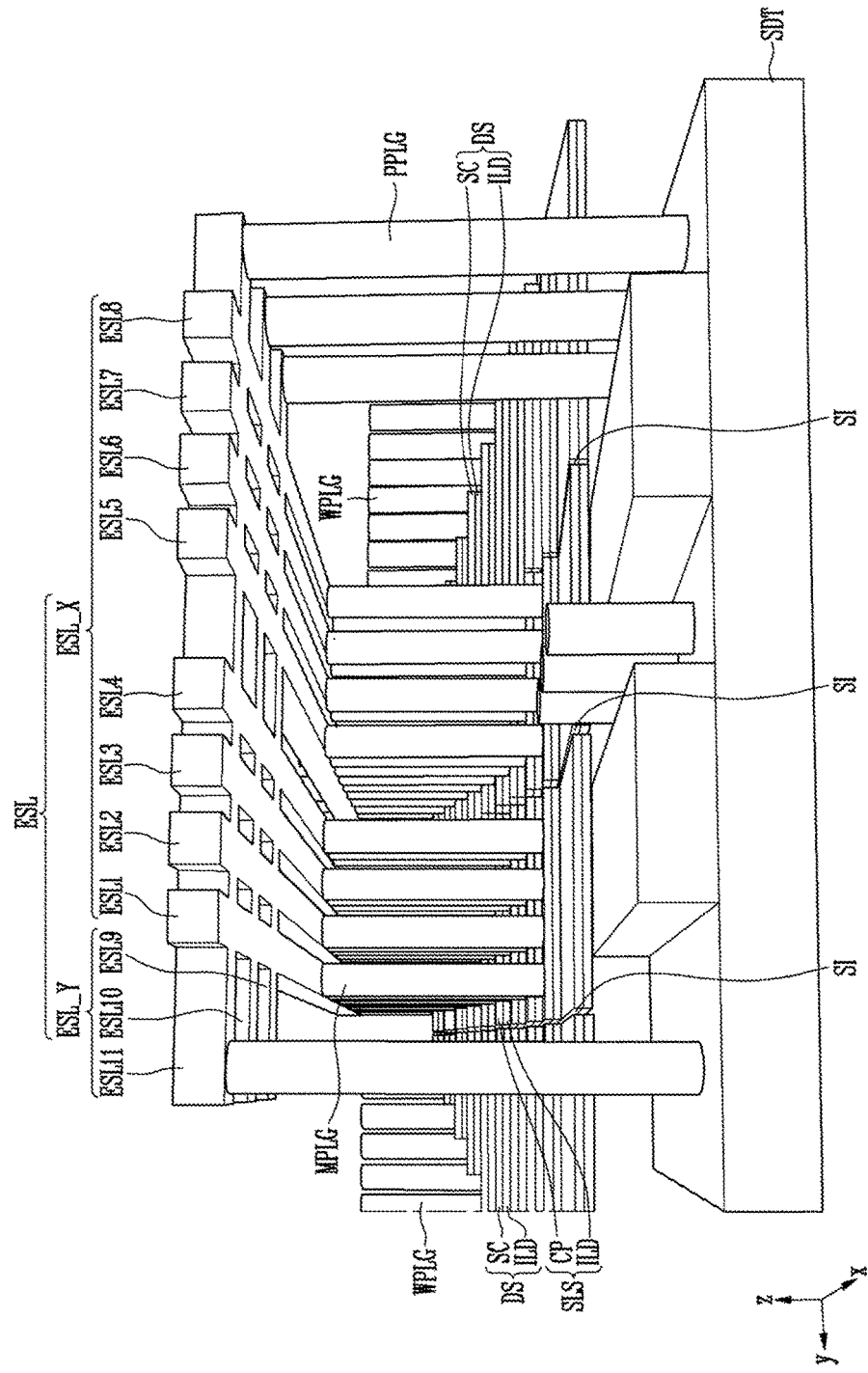
FIG. 3 is a side view in an x-direction of FIG. 2 provided to illustrate the vertical stack mesh structure.

FIG. 3 is a side view in an x-direction of FIG. 2 provided to illustrate the vertical stack mesh structure.

Referring to FIG. 3, each of a plurality of strands ESL 1 to ESL 8 (ESL_X) extending in the x-direction of the source pick-up line ESL may be coupled to the corresponding metal line contact plugs MPLG that are coupled to the stacked conductive patterns CP of the source coupling structure SLS. Each of a plurality of strands ESL9 to ESL11 (ESL_Y) extending in y-direction of the source pick-up line ESL may be coupled to the source discharge transistor SDT through the corresponding peripheral contact plugs PPLG.

The conductive patterns CP that are stacked in a stepwise structure on the metal line contact region MCTR may be separated from the memory cell strings of the cell array region CAR by the corresponding slit SI formed therebetween. The source coupling structure SLS including the interlayer insulating layers ILD and the conductive patterns CP that are alternately stacked on the metal line contact region MCTR is separated from the interlayer insulating layers ILD and the sacrificial layers SC of the dummy structure DS by the corresponding slit SI.

The coupling conductive patterns CP having a stepwise form are coupled, through the metal line contact plugs MPLG, to the source pick-up line ESL disposed over the coupling conductive patterns CP. In this way, an additional electrical current path may be added to a current path extending from the source pick-up line ESL to the source discharge transistor SDT. As such, by having the step-shaped coupling conductive patterns CP and the metal line contact plugs MPLG disposed thereon, the vertical stack mesh structure may have an increased number of current paths extending from the source pick-up line ESL to the source discharge transistor SDT. As a result, the decrease in an interconnect resistance between the source pick-up line ESL and the source discharge transistor SDT may reduce the probability of the source line bouncing phenomenon. The more the number of metal line contact plugs MPLG, the more the effect of reducing the source line bouncing phenomenon of the vertical stack mesh structure increases. In addition, current sensing stability may be achieved by improving current sensing margin.

Figure 4A:
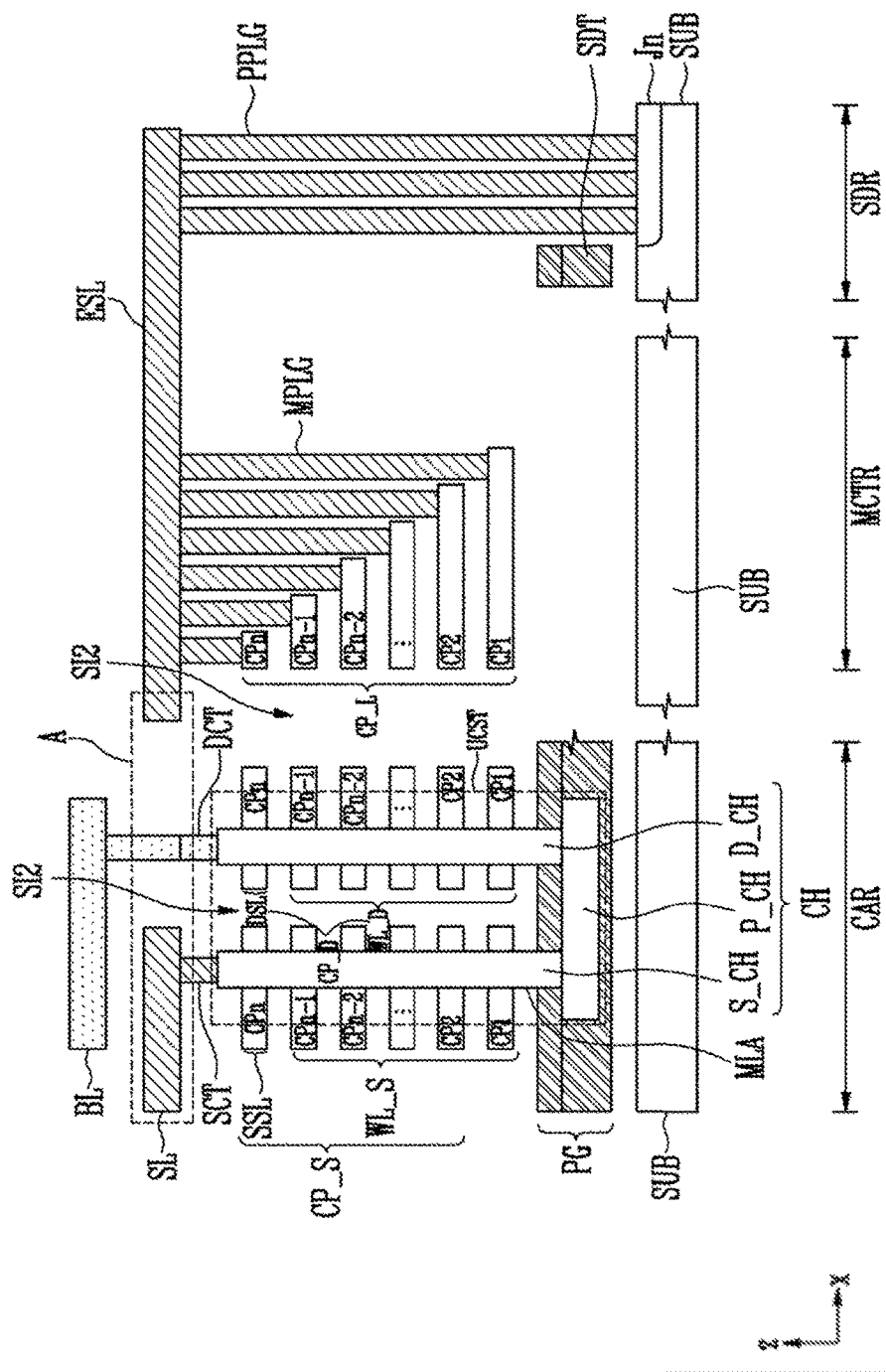
FIGS. 4A and 4B are cross-sectional views illustrating an example of a memory cell string structure and a manner in which a source pick-up line and a common source line are coupled to each other, according to an embodiment of the present disclosure.
Figure 4B:
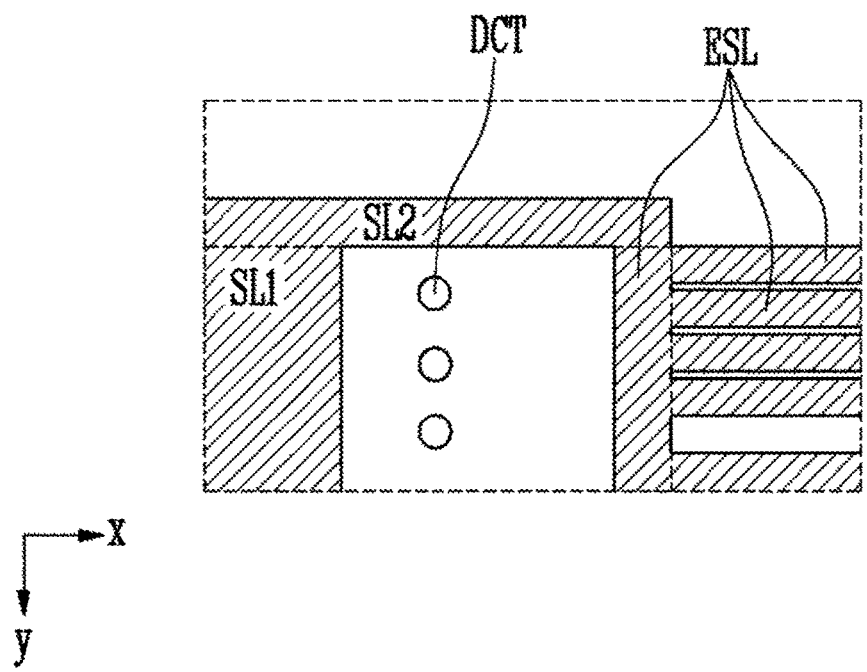

FIGS. 4a and 4b are cross-sectional views illustrating an example of the memory cell string structure and a manner in which the source pick-up line and the common source line are coupled to each other, according to an embodiment of the present disclosure. In particular, FIG. 4a is a cross-sectional view taken along line I-I' of FIG. 2. The insulating layers have been omitted from FIG. 4a for convenience of illustration.

Referring to FIG. 4a, the channel layer CH is formed in the cell array region CAR. The channel layer CH may have various shapes such as a U shape, a W shape and a straight shape. FIG. 4a illustrates the case where the channel layer CH has a U shape.

As shown in FIG. 4a, a U type memory cell string UCST may include memory cells and select transistors arranged along a U-shaped channel layer CH. Gates of the memory cells and gates of the select transistors may be coupled to conductive patterns CP (e.g., CP1 to CPn).

The channel layer CH may include a pipe channel layer P_CH, which is embedded in a pipe gate, and a source side channel layer S_CH and a drain side channel layer D_CH, which extend from the pipe channel layer P_CH. The channel layer CH may be formed in a tube shape. For example, in a case where a central region of a U-shaped hole is filled with a core insulating layer, the channel layer CH may enclose the core insulating layer. Alternatively, the channel layer CH may be formed in the central region of the U-shaped hole. For example, the central region of the U-shaped hole may be filled with the channel layer CH. One end of the channel layer CH may be electrically coupled to a common source line SL, and the other end of the channel layer CH may be electrically coupled to a bit line BL. The bit line BL and the common source line SL are disposed at different layers and spaced apart from each other. For example, the common source line SL may be disposed below the bit line BL. The common source line SL may be electrically coupled to an upper end of the source side channel layer S_CH. A source contact plug may be formed between the common source line SL and the source side channel layer S_CH. The bit line BL may be electrically coupled to an upper end of the drain side channel layer D_CH. The bit line BL may extend in a direction intersecting the common source line SL. A drain contact plug DCT may be formed between the bit line BL and the drain side channel layer D_CH.

As described above, the bit line BL and the common source line SL are disposed at different layers, and the common source line SL may be disposed below the bit line BL. The source pick-up line ESL may be disposed over the metal line contact region MCTR. The source pick-up line ESL may be disposed on the same level as that of the common source line SL. For example, the source pick-up line ESL may be a conductor line extending from the common source line SL. The common source line SL has a bypass structure to avoid being coupled to the drain contact plugs DCT. For example, as shown in FIG. 4b, the common source line SL may include a first line portion SL1, which extends in x-direction, and a second line portion SL2, which extends from the first line portion SL1 toward the source pick-up line ESL in y-direction and is not coupled to the drain contact plugs DCT. The source pick-up line ESL may extend from the second line portion SL2.

Referring to FIG. 4a, the conductive patterns CP1 to CPn may be disposed over the cell array region CAR and the metal line contact region MCTR at an "n" number of layers spaced apart from each other. The conductive patterns CP1 to CPn disposed in the cell array region CAR may include source side conductive patterns CP_S and drain side conductive patterns CP_D. The source side conductive patterns CP_S may enclose the source side channel layer S_CH, and may be stacked on top of each other while maintaining a certain distance from each other. The source side conductive patterns CP_S may include source side word lines WL_S and a source select line SSL. The source select line SSL may be disposed over the source word lines WL_S. The source select line SSL may have a single-layer structure. Alternatively, the source select line SSL may have a multilayer structure. Therefore, although FIG. 4a illustrates the source select line SSL as having a single-layer structure (i.e., CPn), the present disclosure is not limited thereto. The drain side conductive patterns CP_D may enclose the drain side channel layer D_CH, and may be stacked top of each other while maintaining a certain distance from each other. The drain side conductive patterns CP_D may include drain side word lines WL_D and a drain select line DSL. The drain select line DSL may be disposed over the drain side word lines WL_D. The drain select line DSL may have a single-layer structure. Alternatively, the drain select line DSL may have a multilayer structure. Therefore, although FIG. 4a illustrates the drain select line DSL as having a single-layer structure (i.e., CPn), the present disclosure is not limited to this.

The source side conductive patterns CP_S and the drain side conductive patterns CP_D may be separated from each other by a slit SI formed therebetween.

The pipe gate PG may be disposed below the source side conductive patterns CP_S and the drain side conductive patterns CP_D, and may enclose the pipe channel layer P_CH. The pipe gate PG may be disposed below the conductive patterns CP1 to CPn.

As shown in FIG. 4a, an outer surface of the channel layer CH may be enclosed by a multi-layer MLA. The multi-layer MLA may include a tunnel insulating layer, a data storage layer, and a blocking insulating layer. The tunnel insulating layer may be formed in a shape corresponding to the shape of the outer surface of the channel layer CH. The data storage layer may be formed in a shape corresponding to the shape of an outer surface of the tunnel insulating layer. The blocking insulating layer may be formed in a shape corresponding to the shape of an outer surface of the data storage layer.

The source side memory cells are formed at intersections between the source side channel layer S_CH and the source side word lines WL_S. The drain side memory cells are formed at intersections between the drain side channel layer D_CH and the drain side word lines WL_D. The source select transistor is formed at an intersection between the source side channel layer S_CH and the source select line SSL. The drain select transistor is formed at an intersection between the drain side channel layer D_CH and the drain select line DSL. A pipe transistor is formed at an intersection between the pipe channel layer P_CH and the pipe gate PG. The source select transistor, the source side memory cells, the pipe transistor, the drain side memory cells, and the drain select transistor may be arranged along the single channel layer CH, and may be coupled in series through the channel layer CH. The source select transistor, the source side memory cells, the pipe transistor, the drain side memory cells, and the drain select transistor may be coupled in series, and may define the U type memory cell string UCST along the U shape of the channel layer CH.

The conductive patterns CP1 to CPn disposed over the metal line contact region MCTR may be coupling conductive patterns CP_L, and may be separated, by the corresponding slits SI, from the source conductive patterns CP_S and the drain side conductive patterns CP_D disposed over the cell array region.

The coupling conductive patterns CP_L may be stacked in a stepwise structure, and may be coupled to the metal line contact plugs MPLG. The metal line contact plugs MPLG may extend toward the source pick-up line ESL, and may be in contact with the source pick-up line ESL. The source pick-up line ESL extends to a space over the source discharge region SDR. A junction region in of the source discharge transistor may be formed in the source discharge region SDR of the substrate SUB. The junction region in of the source discharge transistor is coupled to the peripheral contact plugs PPLG. The peripheral contact plugs PPLG may extend toward the source pick-up line ESL, and may be in contact with the source pick-up line ESL.

Figure 5:
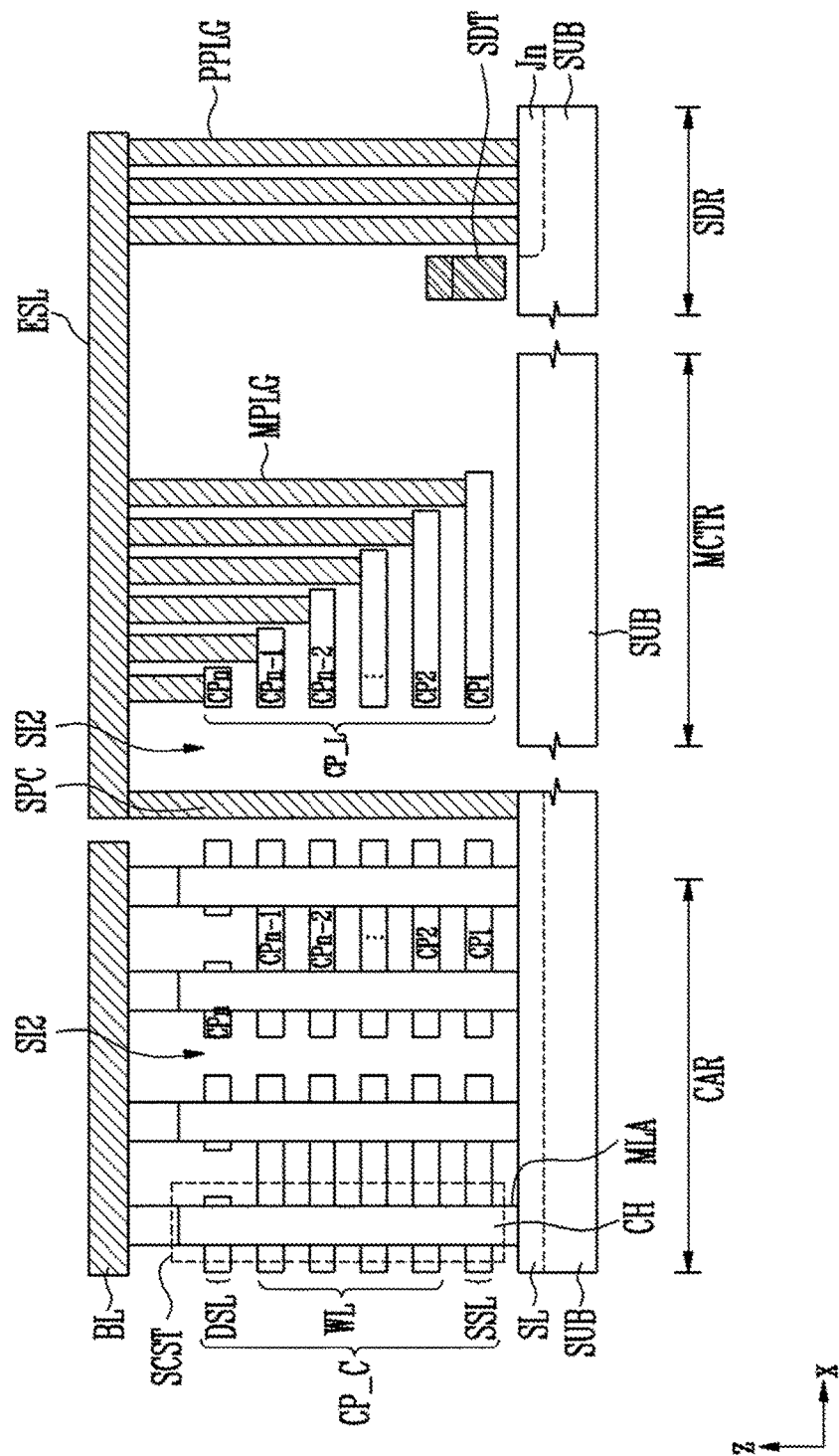
FIG. 5 is a cross-sectional view illustrating an example of a memory cell string structure and a manner in which a source pick-up line and a common source line are coupled to each other, according to an embodiment of the present disclosure.

FIG. 5 is a cross-sectional view illustrating an example of a memory cell string structure and a manner in which the source pick-up line and the common source line are coupled to each other, according to an embodiment of the present disclosure. FIG. 5 is the cross-sectional view taken along line I-I' of FIG. 2. The insulating layers have been omitted from FIG. 5 for convenience of illustration.

Referring to FIG. 5, the channel layer CH may extend in one direction. A straight type memory cell string SCST may include memory cells and select transistors stacked along the channel layer CH. Gates of the memory cells and gates of the select transistors may be coupled to cell conductive patterns CP_C. The cell conductive patterns CP_C may include first to $n^{th}$ conductive patterns CP1 to CPn stacked on the cell array region CAR. The cell conductive patterns CP_C may include at least one layer of source select line SSL, word lines WL disposed over the source select line SSL, and at least one layer of drain select line DSL disposed over the word lines WL.

The channel layer CH passing through the cell conductive patterns CP_C may be formed. The channel layer CH made in the form of a tube may enclose a core insulating layer filling a central region of a hole extending in one direction. Alternatively, the channel layer CH may be formed in the central region of the hole. For example, the central region of the hole may be filled with the channel layer CH. An upper end of the channel layer CH may be electrically coupled to a bit line BL disposed thereabove. A drain contact plug (not illustrated) may be further formed between the bit line BL and the channel layer CH. The channel layer CH may be coupled to a common source line SL. The common source line SL may have various structures. The common source line SL may be in contact with the bottom of the channel layer CH. The common source line SL is disposed below the cell conductive patterns CP_S. The common source line SL may be a doped polysilicon layer formed on the substrate SUB. The common source line SL may be a region that is formed by implanting a dopant into the substrate SUB. The channel layer CH may be in contact with an upper surface of the common source line SL, and may extend toward the bit line BL.

A side wall of the channel layer CH may be enclosed by a multi-layer MLA. The multi-layer MLA may include a tunnel insulating layer, a data storage layer, and a blocking insulating layer. The tunnel insulating layer may be formed in a shape corresponding to the shape of the outer surface of the channel layer CH. The data storage layer may be formed in a shape corresponding to the shape of an outer surface of the tunnel insulating layer. The blocking insulating layer may be formed in a shape corresponding to the shape of an outer surface of the data storage layer.

The common source line SL may be coupled to a source pick-up contact plug SPC. The source pick-up contact plug SPC extends in a direction in which the channel layer CH extends. The source pick-up line ESL is coupled on the source pick-up contact plug SPC. The source pick-up line ESL may be formed at the same level as that of the bit line BL. The source pick-up line ESL extends from a space above the metal line contact region MCTR to a space above the source discharge region SDR. The conductive patterns CP1 to CPn disposed between the source pick-up line ESL and the metal contact region MCTR of the substrate SUB are coupling conductive patterns CP_L, and may be separated from the cell conductive patterns CP_C by slits SI. The coupling conductive patterns CP_L may be stacked in a stepwise structure, and may be coupled to the metal line contact plugs MPLG. The metal line contact plugs MPLG may extend toward the source pick-up line ESL, and may be in contact with the source pick-up line ESL. A junction region in of the source discharge transistor may be formed in the source discharge region SDR of the substrate SUB. The junction region in of the source discharge transistor may be coupled to the peripheral contact plugs PPLG. The peripheral contact plugs PPLG may extend toward the source pick-up line ESL, and may be in contact with the source pick-up line ESL.

FIGS. 6a to 6d are cross-sectional views taken along line I-I' of FIG. 2 to illustrate an example method of manufacturing a semiconductor device according to an embodiment of the present disclosure.

Figure 6A:
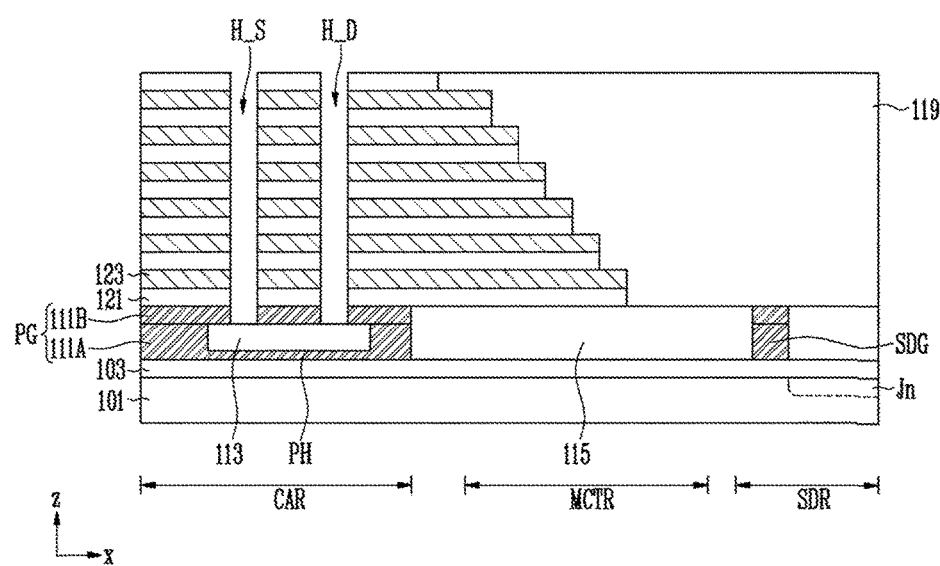
FIGS. 6A to 6D are cross-sectional views taken along line I-I' of FIG. 2 to illustrate an example method of manufacturing a semiconductor device according to an embodiment of the present disclosure.

Referring to FIG. 6a, a gate insulating layer 103 is formed on the semiconductor substrate 101. The gate insulating layer 103 may be formed by oxidizing a surface of the semiconductor substrate 101. Alternatively, the gate insulating layer 103 may be formed by depositing an oxide layer on the semiconductor substrate 101.

Thereafter, a first conductive layer 111A is formed on the gate insulating layer 103. After the first conductive layer 111A has been formed, a pipe hole PH is formed by etching a portion of the first conductive layer 111A. The pipe hole PH is disposed in the cell array region CAR of the semiconductor substrate 101. Thereafter, the pipe hole PH is filled with a sacrificial layer 113. Subsequently, a second conductive layer 111B may be further formed on the first conductive layer 111A including the pipe hole PH filled with the sacrificial layer 113. Thereafter, a pipe gate PG and a gate pattern SDG are formed by etching portions of the first and second conductive layers 111A and 111B. The pipe gate PG is formed in the cell array region CAR of the semiconductor substrate 101, and the gate pattern SDG is formed in the source discharge region SDR of the semiconductor substrate 101.

Subsequently, junction regions in are formed by implanting dopants into the semiconductor substrate 101 on opposite sides of the gate pattern SDG. In this way, the source discharge transistor including the gate pattern SDG and the junction regions in may be formed. The junction regions in are used as a source region and a drain region.

Thereafter, an empty space between the pipe gate PG and the source discharge transistor may be filled with an insulation material 115. Subsequently, first material layers 121 and second material layers 123 are alternately stacked over the semiconductor substrate 101 on which the pipe gate PG and the source discharge transistor have been formed. The second material layers 123 may define regions in which the conductive patterns are to be disposed, and the first material layers 121 may define regions in which the interlayer insulating layers are to be disposed. The second material layers 123 are formed of a material different from that of the first material layers 121. For example, the first material layers 121 may be formed of an insulating material that is to be used as an interlayer insulating layer, and the second material layers 123 may be formed of an insulating material that is to be used as a sacrificial layer and has an etch rate different from that of the first material layers 121. In this case, the first material layers 121 may be formed of a silicon oxide material, and the second material layers 123 may be formed of a silicon nitride material. After the first and second material layers 121 and 123 have been formed, a stepwise structure may be formed by etching them. Here, the first and second material layers 121 and 123 on the metal line contact region MCTR may be partially removed. Although not shown in FIG. 6a, the first and second material layers 121 and 123 on the word line contact region WCTR that come into contact with at least one of four sides of the cell array region CAR may be also partially removed. Although not shown in FIG. 6a, the first and second material layers 121 and 123 on the dummy structure region DSR may be also partially removed. Thereafter, a planarization insulating layer 119 may be formed to cover the stepwise structures and the source discharge transistor.

Subsequently, first slits (not illustrated) passing through the first and second material layers 121 and 123 may be formed. Some of the first slits may be used as a structure that separates the first and second material layers 121 and 123 on a memory block basis. Thereafter, the first slits (not illustrated) are filled with first slit insulating layers (not illustrated). The first slit insulating layers may be used to support the first and second material layers 121 and 123.

Some of the first slits and the first slit insulating layers may pass through the first and second material layers 121 and 123 that are disposed between the metal line contact region MCTR and the dummy structure region DSR.

Thereafter, at least a pair of first and second through holes H_S and H_D passing through the first and second material layers 121 and 123 and exposing the sacrificial layer 113 may be formed. The first and second through holes H_S and H_D may further pass through the second conductive layer 111B such that the first and second through holes H_S and H_D are coupled to the pipe hole PH.

The process of forming the stepwise structure and the process of forming the first and second through holes H_S and H_D may be performed in various sequences without being limited to the above-described sequence.

Figure 6B:
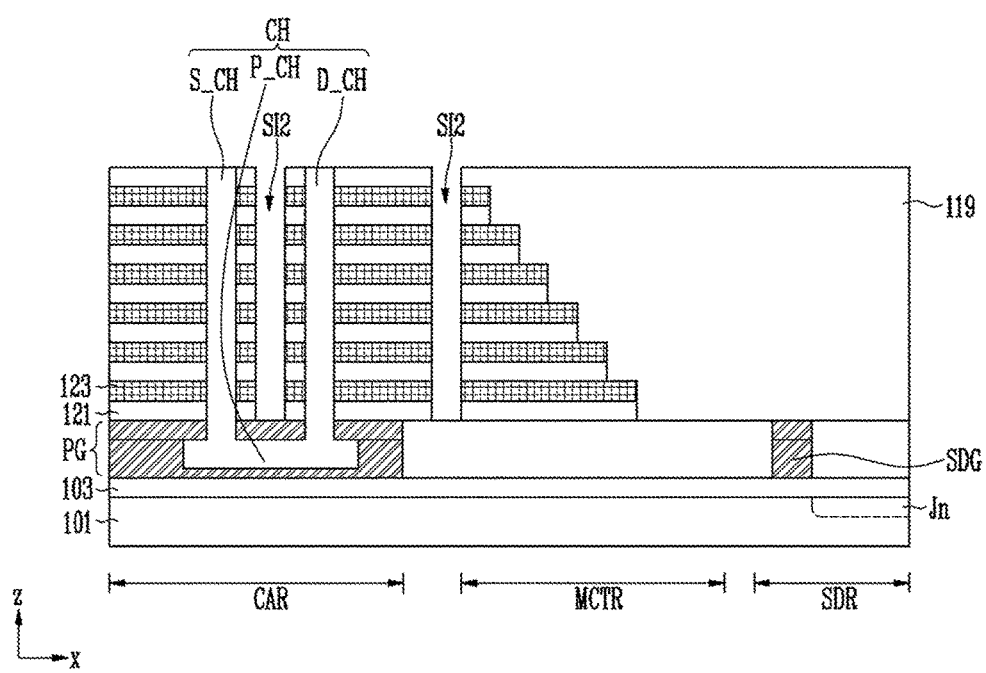

Referring to FIG. 6b, the sacrificial layer (113 of FIG. 6a) exposed through the first and second through holes H_S and H_D is removed to open the pipe hole (PH of FIG. 6a). Thereafter, the pipe hole (PH of FIG. 6a) and the first and second through holes H_S and H_D may be filled with the semiconductor layer so as to form the channel layer CH. The channel layer CH may be divided into a pipe channel layer P_CH filling the pipe hole, a source side channel layer S_CH filling the first through hole, and a drain side channel layer D_CH filling the second through hole. Before the channel layer CH is formed, a tunnel insulating layer (not illustrated) may be further formed along surfaces of the pipe hole and the first and second through holes. Before the tunnel insulating layer is formed, a data storage layer (not illustrated) may be further formed along surfaces of the pipe hole and the first and second through holes. Before the data storage layer is formed, a blocking insulating layer (not illustrated) may be further formed along surfaces of the pipe hole and the first and second through holes. The tunnel insulating layer may be formed of a silicon oxide layer. The data storage layer may be formed of a silicon nitride layer capable of trapping charges. The blocking insulating layer may be formed of a silicon oxide layer or a high dielectric insulating layer having a dielectric constant higher than that of the silicon oxide layer. For example, the blocking insulating layer may be formed of $Al_2O_3$.

After the channel layer CH has been formed, second slits SI2 passing through the first and second material layers 121 and 123 may be formed. Some of the second slits SI2 pass through the first and second material layers 121 and 123 that are disposed between the source side channel layer S_CH and the drain side channel layer D_CH, and the other of the second slits SI2 passes through the first and second material layers 121 and 123 that are disposed between the cell array region CAR and the metal line contact region MCTR. In this way, the first and second material layers 121 and 123 may be separated by the second slits SI2 into a first stack, which encloses the source side channel layer S_CH, a second stack, which encloses the drain side channel layer D_CH, and a third stack in the metal line contact region MCTR. Some of the second slits SI2 pass through the first and second material layers 121 and 123 disposed in the metal line contact region MCTR.

Figure 6C:
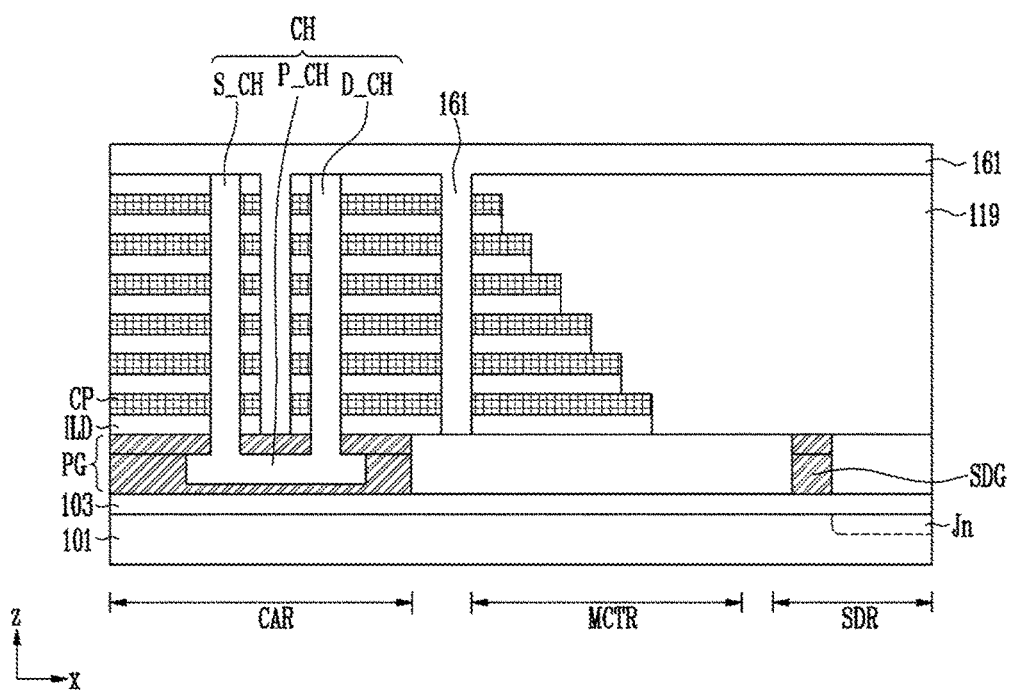

Referring to FIG. 6c, the second material layers 123 exposed by the second slits SI2 are removed. Here, the first slit insulating layer (not illustrated) filling the first slit (not illustrated) may be used to support the first to the third stacks.

Thereafter, a region from which the second material layers 123 have been removed is filled with conductive material. Among the processes described with reference to FIGS. 6a and 6b, if any one of the processes of forming the tunnel insulating layer (not illustrated), the data storage layer (not illustrated) and the blocking insulating layer (not illustrated) that enclose an outer surface of the channel layer CH is omitted, the tunnel insulating layer, the data storage layer or the blocking insulating layer may be formed before the conductive material is formed.

The tunnel insulating layer may be in contact with the outer surface of the channel layer CH. The data storage layer may be in contact with an outer surface of the tunnel insulating layer. The blocking insulating layer may be formed to make contact with an outer surface of the data storage layer.

After the conductive material has been formed, a portion of the conductive material in the second slits SI2 is removed to form conductive patterns CP that are disposed at different heights and separated from each other. The first material layers may remain as interlayer insulating layers ILD between which any one of the conductive patterns CP is disposed.

Thereafter, a second slit insulating layer 161 having a thickness sufficient to fill the second slits SI2 is formed on the structure in which the conductive patterns CP are formed.

Figure 6D:
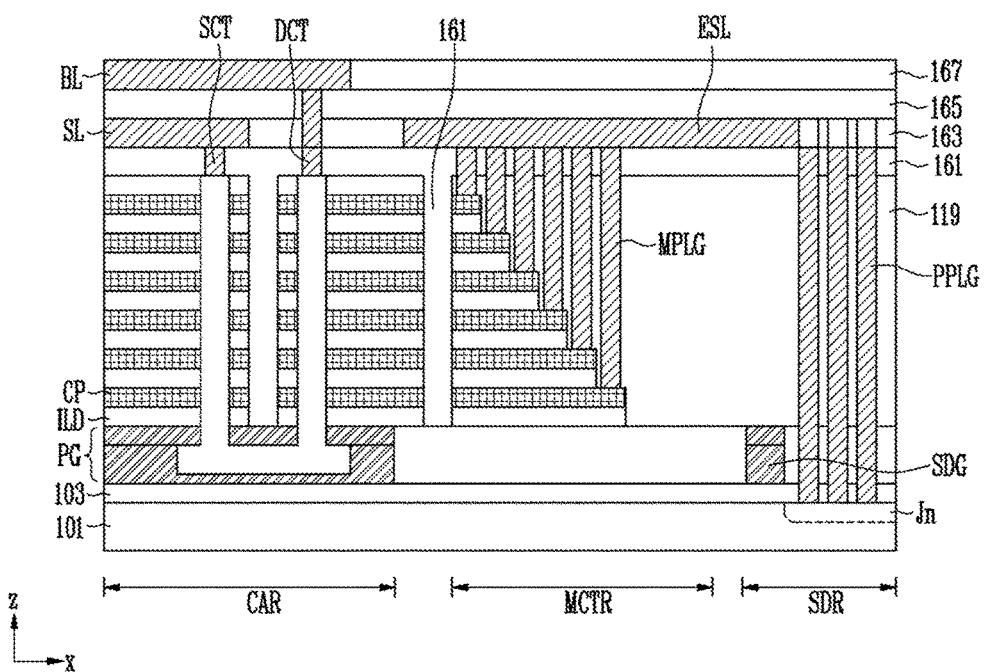

Referring to FIG. 6d, after the second slit insulating layer 161 has been formed, a lower end of a drain contact plug DCT and a source contact plug SCT may be formed to pass through the second slit insulating layer 161, and may be coupled to the channel layer CH. After the second slit insulating layer 161 has been formed, peripheral contact plugs PPLG may be further formed to pass through the second slit insulating layer 161 and the planarization insulating layer 119, and may be coupled to any one of the junction regions in of the source discharge transistor. After the second slit insulating layer 161 has been formed, metal line contact plugs MPLG may be further formed to pass through the second slit insulating layer 161 and the planarization insulating layer 119, and may be coupled to the conductive patterns CP stacked on the metal line contact region MCTR.

Subsequently, an upper insulating layer 163 may be formed on the structure in which the lower end of the drain contact plug DCT, the source contact plug SCT, the peripheral contact plugs PPLG, and the metal line contact plugs MPLG are formed. A common source line SL that passes through the upper insulating layer 163 and is coupled to the source contact plug SCT may be formed. In addition, a source pick-up line ESL that passes through the upper insulating layer 163 and is coupled to the peripheral contact plugs PPLG and the metal line contact plugs MPLG may be formed. As described with reference to FIGS. 4a and 4b, the common source line SL and the source pick-up line ESL may be coupled to each other. The source pick-up line ESL, as described with reference to FIG. 3, may have a structure including a plurality of strands extending in the row direction (e.g., x-direction) and the column direction (e.g., y-direction) so that the source pick-up line ESL along with the metal line contact plugs MPLG forms a vertical stack mesh structure.

Thereafter, an upper insulating 165 is formed on the structure in which the common source line SL and the source pick-up line ESL are formed. Subsequently, an upper end of the drain contact plug DCT may be formed to pass through the upper insulating layers 163 and 165 formed over the lower end of the drain contact plug DCT, and may be coupled to the lower end of the drain contact plug DCT.

An upper insulating layer 167 is formed on the structure in which the upper end of the drain contact plug DCT is formed. Thereafter, a bit line BL passing through the upper insulating layer 167 and coupled to the drain contact plug DCT may be formed.

The semiconductor device shown in FIG. 5 may be formed using some processes described with reference to FIGS. 6a to 6d.

Figure 7:
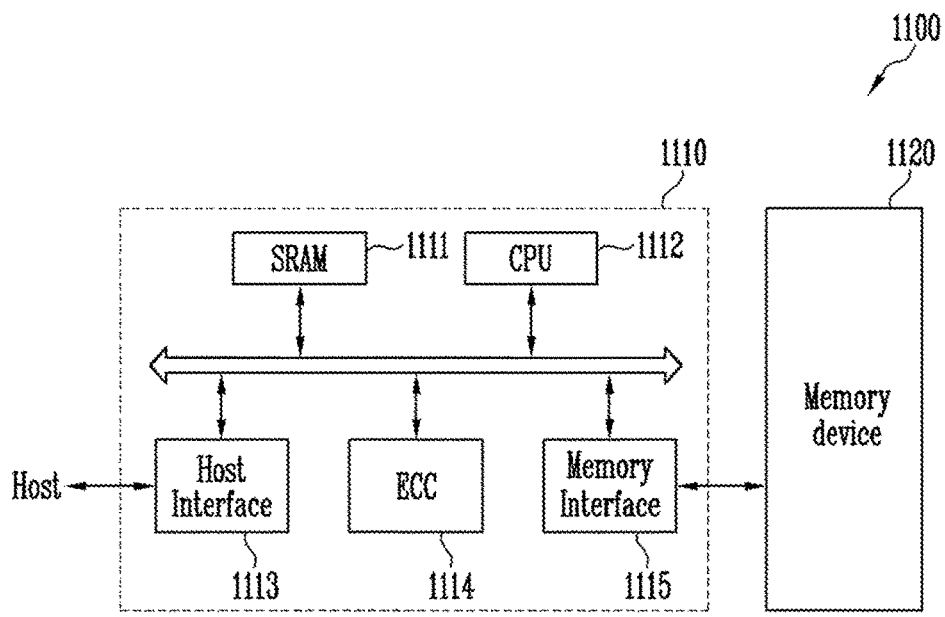
FIG. 7 is a diagram illustrating an example of a memory system according to an embodiment of the present disclosure.

FIG. 7 is a diagram illustrating an example of a memory system according to an embodiment of the present disclosure.

Referring FIG. 7, the memory system 1100 according to an embodiment may include a memory device 1120 and a memory controller 1110.

The memory device 1120 may include the structure described with reference to FIGS. 1 to 5. For example, the memory device 1120 may provide a current path between the source discharge transistor and the common source line coupled to the channel layer of the cell array region, using the vertical stack mesh structure including the conductive patterns stacked on the metal line contact region and the metal line contact plugs coupled the conductive patterns. The memory device 1120 may be a multi-chip package including a plurality of memory chips.

The memory controller 1110 may control the memory device 1120, and may include a static random access memory (SRAM) 1111, a CPU 1112, a host interface 1113, an error correction code (ECC) 1114, and a memory interface 1115. The SRAM 1111 may be used as a cache memory of the CPU 1112. The CPU 1112 performs overall control operations for data exchange of the memory controller 1110. The host interface 1113 is provided with a data interchange protocol of a host coupled with the memory system 1100. Furthermore, the ECC 1114 detects and corrects an error in the data read from the memory device 1120. The memory interface 1115 interfaces with the memory device 1120. In addition, the memory controller 1110 may further include a read only memory (ROM) or the like that stores code data for interfacing with the host.

The above-described memory system 1100 may be a memory card or a solid state disk (SSD) equipped with the memory device 1120 and the controller 1110. For example, when the memory system 1100 is an SSD, the memory controller 1110 may communicate with an external device (e.g., host) via one of various interface protocols, such as a Universal Serial Bus (USB), a Multi Media Card (MMC), a Peripheral Component Interconnection-Express (PCI-E), a Serial Advanced Technology Attachment (SATA), a Parallel Advanced Technology Attachment (PATA), a Small Computer Small Interface (SCSI), an Enhanced Small Disk Interface (ESDI), or an Integrated Drive Electronics (IDE).

Figure 8:
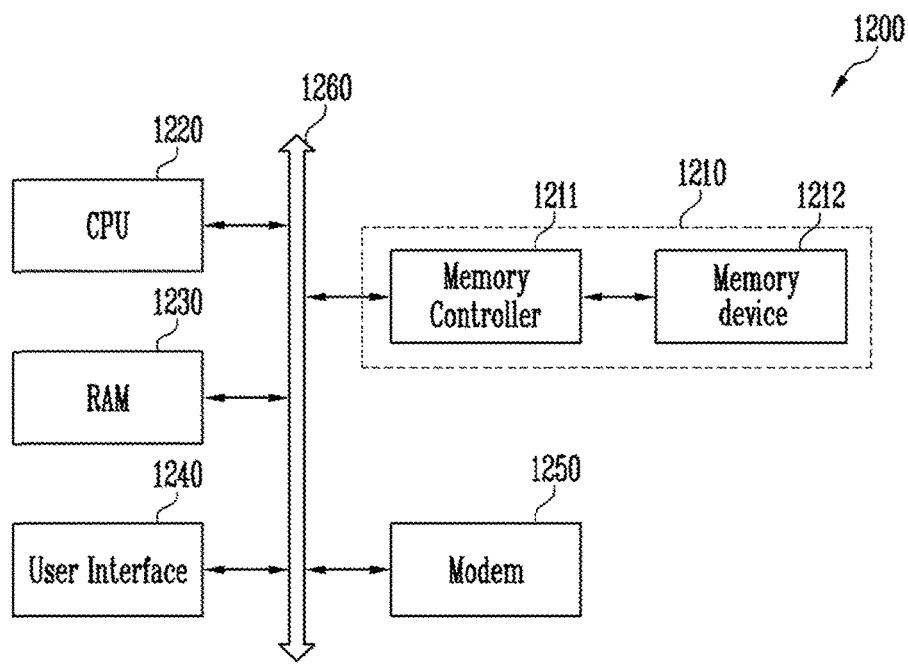
FIG. 8 is a diagram illustrating an example of a computing system in accordance with an embodiment of the present disclosure.

FIG. 8 is a diagram illustrating an example of a computing system in accordance with an embodiment of the present disclosure.

Referring to FIG. 8, the computing system 1200 in accordance with an embodiment of the present disclosure may include a CPU 1220, a RAM 1230, a user interface 1240, a modem 1250, and a memory system 1210 that are electrically coupled to a system bus 1260. Furthermore, if the computing system 1200 is a mobile device, it may further include a battery for supplying operating voltage to the computing system 1200. The computing system 1200 may further include an application chip set, a camera image processor CIS, a mobile DRAM and the like.

As described above with reference to FIG. 7, the memory system 1210 may be configured with the memory device 1212 and the memory controller 1211.

According to an embodiment of the present disclosure, a source line bouncing phenomenon may be mitigated without an increase in size of a memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
   a cell structure comprising alternately stacked first conductive patterns and first interlayer insulating layers enclosing a channel layer;
   a source coupling structure physically separated from the cell structure by a slit and comprising alternately stacked second conductive patterns and second interlayer insulating layers; and
   a source discharge transistor coupled to the source coupling structure.

2. The semiconductor device according to claim 1, wherein the source coupling structure and the source discharge transistor are electrically coupled to each other through:
   metal line contact plugs coupled to the second conductive patterns;
   a source pick-up line coupled to the metal line contact plugs; and
   peripheral contact plugs disposed between the source pick-up line and a junction region of the source discharge transistor.

3. The semiconductor device according to claim 2, further comprising a common source line configured to couple the source pick-up line to the channel layer.

4. The semiconductor device according to claim 3, wherein:
   the common source line is coupled to a first upper end of the channel layer; and
   the source pick-up line extends from the common source line.

5. The semiconductor device according to claim 4, wherein the source pick-up line and the common source line are formed in the same layer.

6. The semiconductor device according to claim 5, further comprising a bit line contact plug electrically connecting a bit line to a second upper end of the channel layer, wherein:
   the common source line and the bit line are formed at different layers; and
   the common source line comprises a first line extending to the source pick-up line, and a second line extending from the first line to the source pick-up line via the bit line contact plug.

7. The semiconductor device according to claim 2, wherein the source pick-up line comprises a plurality of first strands extending toward the source discharge transistor and a plurality of second strands extending across the first strands.

8. The semiconductor device according to claim 7, wherein the metal line contact plugs are coupled to the first strands of the source pick-up line, and the peripheral contact plugs are coupled to the second strands of the source pick-up line.

9. The semiconductor device according to claim 3, wherein the common source line is coupled to a lower end of the channel layer, and the source pick-up line is electrically coupled to the common source line by a source pick-up contact plug coupled to the common source line.

10. The semiconductor device according to claim 9, wherein a bit line is coupled to an upper end of the channel layer, and the source pick-up line and the bit line are formed in the same layer.

11. The semiconductor device according to claim 1, wherein the second conductive patterns are stacked in a stepwise structure.

12. The semiconductor device according to claim 1, wherein the second conductive patterns and the first conductive patterns are formed of the same material in the same layer.

13. The semiconductor device according to claim 1, further comprising a dummy structure separated from the cell structure and the source coupling structure, the dummy structure comprising alternately stacked third interlayer insulating layers and sacrificial layers.

14. The semiconductor device according to claim 13, wherein the dummy structure is formed in a stepwise structure.

15. The semiconductor device according to claim 14, wherein the first interlayer insulating layers, the second interlayer insulating layers, and the third interlayer insulating layers are formed of the same material in the same layer.

16. A method of manufacturing a semiconductor device, comprising:
   forming a source discharge transistor on a substrate;
   forming, on the source discharge transistor, a stack formed by alternately stacking first material layers and second material layers;
   forming a slit dividing the stack into a first stack and a second stack;
   replacing the second material layers of the first and second stacks with conductive patterns through the slit, and forming a cell structure and a source coupling structure;
   forming contact plugs coupled to the conductive patterns of the source coupling structure and the source discharge transistor; and
   forming, on the contact plugs, a source pick-up line coupling the source discharge transistor to the source coupling structure,
   wherein the cell structure comprises the first stack and the source coupling structure comprises the second stack.

17. The method according to claim 16, further comprising, before replacing the second material layers with the conductive patterns, forming a hole passing through the first material layers and the second material layers stacked in the first stack, and forming a channel layer by filling the hole with a semiconductor layer.

18. The method according to claim 17, wherein forming the contact plugs comprises forming a source contact plug coupled to a first upper end of the channel layer, and forming a lower end of a drain contact plug coupled to a second upper end of the channel layer.

19. The method according to claim 18, wherein forming the source pick-up line comprises forming a common source line coupled to the source contact plug.

20. The method according to claim 17, wherein forming the contact plugs comprises forming a source pick-up contact plug coupled to a source line coupled to a lower end of the channel layer.

* * * * *